(12) United States Patent  
Zhang et al.

(10) Patent No.: US 9,379,292 B2  
(45) Date of Patent: Jun. 28, 2016

(54) LED LIGHT SOURCE PACKAGING METHOD, LED LIGHT SOURCE PACKAGE STRUCTURE AND LIGHT SOURCE MODULE

(71) Applicant: Ningbo Sunpu Led Co., Ltd., Ningbo (CN)

(72) Inventors: Riguang Zhang, Ningbo (CN); Sheng Lin, Ningbo (CN); Yaohua Zhang, Ningbo (CN); Yuanbao Du, Ningbo (CN)

(73) Assignee: Ningbo Sunpu Led Co., Ltd., Ningbo (CN)

( * ) Notice: Subject to any disclaimer, the term of this patent is extended or adjusted under 35 U.S.C. 154(b) by 0 days.

(21) Appl. No.: 14/561,946

(22) Filed: Dec. 5, 2014

(65) Prior Publication Data

US 2015/0349211 A1    Dec. 3, 2015

(30) Foreign Application Priority Data

Jun. 3, 2014   (CN) .......................... 2014 1 0244383

(51) Int. Cl.  
*H01L 33/08* (2010.01)  
*H01L 33/50* (2010.01)  
(Continued)

(52) U.S. Cl.  
CPC .......... *H01L 33/50* (2013.01); *H01L 27/14618* (2013.01); *H01L 33/08* (2013.01); *H01L 33/52* (2013.01); *H01L 33/62* (2013.01); *H01L 2224/48091* (2013.01); *H01L 2224/48137* (2013.01); *H01L 2224/48465* (2013.01); *H01L 2224/48471* (2013.01); *H01L 2224/48479* (2013.01); *H01L 2224/49107* (2013.01); *H01L 2251/5376* (2013.01); *H01L 2924/181* (2013.01); *H01L 2933/0033* (2013.01); *H01L 2933/0041* (2013.01); *H01L 2933/0066* (2013.01)

(58) Field of Classification Search  
CPC ......... H01L 33/08; H01L 33/50; H01L 33/52; H01L 27/14618; H01L 2251/5376  
See application file for complete search history.

(56) References Cited

U.S. PATENT DOCUMENTS

| | | | |
|---|---|---|---|
| 2010/0096965 A1 | 4/2010 | Oyaizu et al. | |
| 2012/0080713 A1* | 4/2012 | Agatani | H01L 25/0753 257/99 |
| 2012/0250304 A1 | 10/2012 | Harbers et al. | |

(Continued)

FOREIGN PATENT DOCUMENTS

| | | |
|---|---|---|
| CN | 1790754 A | 6/2006 |
| CN | 101725850 A | 6/2010 |

(Continued)

OTHER PUBLICATIONS

First Office Action in Chinese Patent Application No. 201410244383.7, issued Apr. 5, 2016.

*Primary Examiner* — Phat X Cao  
(74) *Attorney, Agent, or Firm* — Venable LLP; Henry J. Daley; Trent B. Ostler

(57) ABSTRACT

A method for packaging LED light source, a package structure of LED light source and a light source module are provided. The method for packaging LED light source includes providing a substrate integrated with LED chips, where a surface of the substrate is provided with a filling layer configured to cover the LED chips; printing, on the a surface of the filling layer, phosphor patterns to cover the surface of the filling layer, where the phosphor patterns include one or more first phosphor patterns, one or more second phosphor patterns and one or more third phosphor patterns, where every two of the first, the second and the third phosphor patterns are adjacent to each other. The package structure of LED light source and the light source module have good uniformity of light-emission and low cost, and the process of the method for packaging LED light source is simple.

20 Claims, 9 Drawing Sheets

(51) Int. Cl.
*H01L 33/52* (2010.01)
*H01L 27/146* (2006.01)
*H01L 33/62* (2010.01)

(56) References Cited

U.S. PATENT DOCUMENTS

2014/0367633 A1* 12/2014 Bibl .................. G02F 1/133603
257/13

FOREIGN PATENT DOCUMENTS

| | | |
|---|---|---|
| CN | 101876406 A | 11/2010 |
| CN | 102522382 A | 6/2012 |
| CN | 102709280 A | 10/2012 |
| CN | 202678308 U | 1/2013 |
| CN | 103500787 A | 1/2014 |
| CN | 103582778 A | 2/2014 |
| JP | 2003-298120 A | 10/2003 |

\* cited by examiner

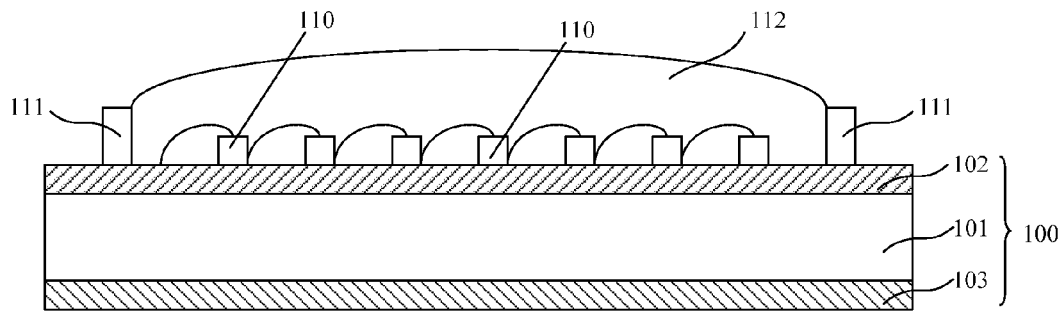

Figure 1

```
provide a substrate integrated with LED chips, where a surface of the substrate is     S101
provided with a filling layer configured to cover the LED chips
```

```
print, on the a surface of the filling layer, phosphor patterns to cover the surface
of the filling layer, where the phosphor patterns include one or more first            S102
phosphor patterns, one or more second phosphor patterns and one or more third
phosphor patterns, where every two of the first, the second and the third phosphor
patterns are adjacent to each other
```

Figure 2

Figure 3

LED LIGHT SOURCE PACKAGING METHOD, LED LIGHT SOURCE PACKAGE STRUCTURE AND LIGHT SOURCE MODULE

CROSS REFERENCES OF RELATED APPLICATIONS

The present application claims the priority to Chinese Patent Application No. 201410244383.7, entitled "LED LIGHT SOURCE PACKAGING METHOD, LED LIGHT SOURCE PACKAGE STRUCTURE AND LIGHT SOURCE MODULE", filed on Jun. 3, 2014 with the State Intellectual Property Office of People's Republic of China, which is incorporated herein by reference in its entirety.

FIELD

The present disclosure relates to the technical field of LED packaging, and in particular to a method for packaging LED light source, a package structure of LED light source and a light source module.

BACKGROUND

LED (light-emitting diode) is a kind of p-n junction, which can emit spontaneous-emission light in regions of ultraviolet light, visible light or infrared light. LED light source refers to the light source which utilizes LED as the illuminant. With the development of LED light source, especially the development of the high-brightness LED light source, the packaging technology of LED light source becomes one of the research focuses.

The package for LED light source is an important part of a LED. Like the package for discrete semiconductor elements, it is required that the package of LED light source may prevent a LED chip from being effected by the external environment and may improve the abilities of heat dissipation and conduction. In addition to this, the package of LED light source has special natures. Differing from the package of discrete semiconductor element, the package of LED light source is required to improve light-emission efficiency, realize specific optics profile and output visible light, etc.

The conventional common package of LED light source includes lead package, surface mount package and chip on board (COB) package. In the COB package, a chip is integrated directly to a high thermal conductive material. Compared with the conventional package of LED light source, the COB package is characterized in that multiple LED chips may be packaged directly onto a printed circuit board with a metal or ceramic substrate, and the heat is dissipated directly via the printed circuit board, thereby not only simplifying the manufacturing process of frame and reducing the cost thereof, but also reducing effectively the thermal resistance of device. The LED light source with COB package has good heat dissipation performance and good cost performance, thus it has high market competitiveness.

For conventional COB packaging technology of LED light source, reference may be made to Chinese patent with publication No. CN103500787A published on Jan. 8, 2014. The package structure formed by means of the COB packaging technology is shown in FIG. 1, including: a substrate 100, where the substrate include an insulating ceramic substrate 101, a metal circuit layer 102 disposed on a first surface of the insulating ceramic substrate 101, and a metal film electroplated layer 103 disposed on a second surface of the insulating ceramic substrate 101, where the first surface is opposite to the second surface; LED chips 110 on a surface of the substrate 100; a dam 111 around the LED chips on the surface of the substrate 100; and a filling layer 112 filling the dam 111, where the filling layer 112 is doped with phosphors.

However, the package structure formed by means of the conventional COB packaging technology has poor uniformity of light-emission and high cost.

SUMMARY

It is to provide a method for packaging LED light source, a package structure of LED light source and a light source module which have good uniformity of light-emission, low cost and high color rendering index.

In view of this, a method for packaging LED light source is provided according to an embodiment of the invention, including: providing a substrate integrated with LED chips, where a surface of the substrate is provided with a filling layer configured to cover the LED chips; and printing, on the a surface of the filling layer, phosphor patterns to cover the surface of the filling layer, where the phosphor patterns include one or more first phosphor patterns, one or more second phosphor patterns and one or more third phosphor patterns, where every two of the first, the second and the third phosphor patterns are adjacent to each other.

Optionally, the first phosphor pattern is red, yellow, green or yellowish green phosphor pattern, the second phosphor pattern is red, yellow, green or yellowish green phosphor pattern, and the third phosphor pattern is red, yellow, green or yellowish green phosphor pattern.

Optionally, the first phosphor pattern is red phosphor pattern, the second phosphor pattern is yellow phosphor pattern, and the third phosphor pattern is green phosphor pattern.

Optionally, the red, yellow and green phosphor patterns are all regular hexagon-shaped, every two of the red, yellow and green phosphor patterns are adjacent to each other, and lines jointing centers of the red, yellow and the green phosphor patterns form an equilateral triangle.

Optionally, the red, yellow and green phosphor patterns are all square-shaped, every two of the red, yellow and green phosphor patterns are adjacent to each other, and lines jointing centers of the red, yellow and the green phosphor patterns form an equilateral triangle.

Optionally, a color temperature and a color rendering index of light-emission are controlled by adjusting thicknesses of the first, the second and the third phosphor patterns.

Optionally, the method further includes forming, on the surface of the substrate, a transparent dam doped with phosphors around the LED chips.

Optionally, the transparent dam is made of material suitable for injection moulding.

Optionally, the transparent dam is made of silicone, transparent resin, polycarbonate or polyvinyl chloride.

Optionally, the LED chips are integrated to the substrate by eutectic technology, metal welding or wire-binding.

Optionally, in a case that the LED chips are of a horizontal-structure, the LED chips are integrated to the substrate by means of wire-binding.

Optionally, a metallic bead is formed at a positive terminal of the LED chip with the horizontal-structure and wiring is performed from a negative terminal to the metallic bead at the positive terminal.

Optionally, wiring is performed from a negative terminal of the LED chip with the horizontal-structure to a positive terminal to be connected to the negative terminal, and a metallic bead is planted on a surface of the positive terminal after the wiring.

Optionally, a metallic bead is formed at a positive terminal of the LED chip with the horizontal-structure; wiring is performed from a negative terminal to the metallic bead at the positive terminal; and a metallic bead is planted on a surface of the positive terminal after the wiring.

Optionally, the LED chips are integrated to the substrate by means of eutectic technology in a case that the LED chips are of a flip structure.

Optionally, a connecting wire formed by the wiring has a fishtail-shaped end.

Optionally, the substrate is conductive or non-conductive.

Optionally, the substrate is a ceramic substrate, an aluminum substrate, a glass substrate, a silicon substrate, an aluminium oxide substrate, an aluminum nitride substrate or a copper substrate.

A package structure of LED light source is further provided according to an embodiment of the invention, including: a substrate integrated with LED chips; a filling layer, which is disposed on a surface of the substrate and covers the LED chips; and phosphor patterns covering a surface of the filling layer, where the phosphor patterns include one or more first phosphor patterns, one or more second phosphor patterns and one or more third phosphor patterns, where every two of the first, the second and the third phosphor patterns are adjacent to each other.

Optionally, the first phosphor pattern is red, yellow, green or yellowish green phosphor pattern, the second phosphor pattern is red, yellow, green or yellowish green phosphor pattern, and the third phosphor pattern is red, yellow, green or yellowish green phosphor pattern.

Optionally, the first phosphor pattern is red phosphor pattern, the second phosphor pattern is yellow phosphor pattern, and the third phosphor pattern is green phosphor pattern.

Optionally, the red, yellow and green phosphor patterns are all regular hexagon-shaped, every two of the red, yellow and green phosphor patterns are adjacent to each other, and lines jointing centers of the red, yellow and the green phosphor patterns form an equilateral triangle.

Optionally, the red, yellow and green phosphor patterns are all square-shaped, every two of the red, yellow and green phosphor patterns are adjacent to each other, and lines jointing centers of the red, yellow and the green phosphor patterns form an equilateral triangle.

Optionally, the package structure further includes a transparent dam doped with phosphors, which is disposed on the surface of the substrate and around the LED chips.

Optionally, the transparent dam is made of material suitable for injection moulding.

Optionally, the transparent dam is made of silicone, transparent resin, polycarbonate or polyvinyl chloride.

Optionally, in a case that the LED chips are integrated to the substrate by means of wire-binding, the package structure of the LED light source further includes a metallic bead disposed at a positive terminal of a first LED chip, and a binding wire connecting a negative terminal of a second LED chip to the metallic bead at the positive terminal of the first LED chip.

Optionally, in a case that the LED chips are integrated to the substrate by means of wire-binding, the package structure of the LED light source further includes a binding wire connecting a positive terminal of a first LED chip to a negative terminal of a second LED chip, and a metallic bead overlaying the binding wire at the positive terminal of the first LED chip.

Optionally, in a case that the LED chips are integrated to the substrate by means of wire-binding, the package structure of the LED light source further includes a metallic bead disposed at a positive terminal of a first LED chip, a binding wire connecting a negative terminal of a second LED chip to the metallic bead at the positive terminal of the first LED chip, and a metallic bead overlaying the binding wire at the positive terminal of the first LED chip.

A light source module is further provided according to an embodiment of the invention, including: a substrate; one or more LED chips integrated onto a surface of the substrate, where the one or more LED chips are arranged in queues, and LED chips in a queue are sequentially connected; input ports arranged at periphery of the substrate, where an amount of the input ports is equal to an amount of the queues, and the input ports are connected electrically to corresponding queues of LED chips, where the input ports are connected to an external power supply, and a brightness of the light source module is controlled by enabling any queue of LED chips to emit light in response to a control to the power supply.

Optionally, the light source module further includes a transparent dam doped with phosphors which is disposed on the surface of the substrate and around the LED chips.

Optionally, the light source module further includes a filling layer, which is disposed on the surface of the substrate and covers the LED chips; phosphor patterns covering a surface of the filling layer, where the phosphor patterns include one or more red phosphor patterns, one or more yellow phosphor patterns and one or more green phosphor patterns, where every two of the red, yellow and green phosphor patterns are adjacent to each other.

Compared with the conventional technology, the technical solution of the invention has the following advantages.

By the method for packaging LED light source provided according to an embodiment of the invention, red, yellow and green phosphor patterns are printed and regularly arranged on a surface of the package structure of the LED light source, the patterns may cover the surface of the package structure to the largest extent, such that the light-emission is uniform and the surface of the package structure is free of dead-zone, thereby improving the light-emission efficiency and the quality of the light source.

Furthermore, in an embodiment of the invention, the color temperature and the color rendering indexes of light-emission are controlled by adjusting the thicknesses of the red, yellow and green phosphor patterns, such that the color temperature and color rendering indexes of the LED light source may have high controllability.

Furthermore, the structure of LED light source package has a transparent dam doped with phosphors, thereby expanding light-emission angle of the LED light source.

In the package structure of LED light source provided according to an embodiment of the invention, red, yellow and green phosphor patterns are printed and regularly arranged on a surface of the package structure of the LED light source, the patterns may cover the surface of the package structure to the largest extent, such that the light-emission is uniform and the surface of the package structure is free of dead-zone, thereby improving the light-emission efficiency and the quality of the light source.

Furthermore, the structure of LED light source package has a transparent dam doped with phosphors, thereby expanding light-emission angle of the LED light source.

In the light source module provided according to an embodiment of the invention, input ports are arranged at periphery of the substrate, where an amount of the input ports is equal to an amount of the queues, and the input ports are connected electrically to corresponding queues of LED chips, such that a brightness of the light source module is controlled by enabling any queue of LED chips to emit light in response to a control to the power supply, and the brightness may be adjusted flexibly.

BRIEF DESCRIPTION OF THE DRAWINGS

FIG. 1 is a schematic diagram of a package structure formed by means of COB packaging in the conventional technology;

FIG. 2 is a flowchart of a method for packaging LED light source according to an embodiment of the invention;

FIGS. 3-15 show a process of a method for packaging LED light source according to an embodiment of the invention.

DETAILED DESCRIPTION

Figure 4:
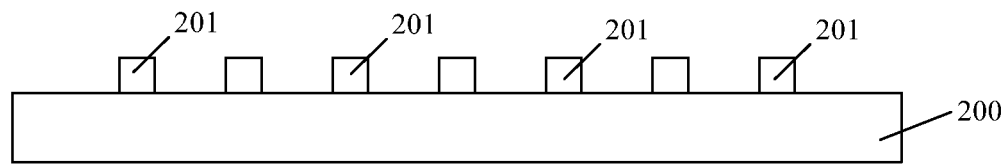

It may be learned from the conventional technology that, a package structure formed by mean of the conventional COB packaging technology has poor light-emission uniformity and high cost. In addition, the package structure formed by mean of the conventional COB packaging technology has poor capability in adjusting color temperature and color rendering index.

In view of these drawbacks, it is founded from an intensive study that, a filling layer doped with phosphors commonly serves to recombine light color. The poor light-emission uniformity of the package structure formed by mean of the conventional COB packaging technology is due to the following reasons: taking a white-light light source as an example, phosphors doped into the filling layer is for creating white light via light color recombination; in an example, a LED chip emitting blue light cooperates with yellow phosphors, in which the blue light emitted by the LED chip excites the yellow phosphors to emit yellow light, and then the blue and yellow light are mixed into white light; however, phosphor particles not distributed uniformly in the filling layer result in excited yellow light that is not distributed uniformly, and the phosphor particles which can hardly have uniform sizes also result in excited yellow light that is not uniform, such that the white light mixed by the blue and yellow light is not uniform; it may further be noted that, in the way that the blue light excites the phosphors to emit yellow light and then the blue and the excited yellow light are mixed into white light, it may be difficult to control the uniformity of the white light.

In another example, a LED chip emitting blue light cooperates with red phosphors, yellow phosphors and green phosphors, blue light emitted by the LED chip excites the phosphors to emit red, yellow and green light, and then the excited red, yellow and green light are mixed into white light. However, like the previous example, phosphor particles are not distributed uniformly in the filling layer. In this example, because there are three kinds of phosphors, the phosphors are more difficult to be distributed uniformly, and the particle sizes of the phosphors are difficult to be uniform. In addition, the light may be absorbed by the phosphors due to the multiple kinds of phosphors, such that the mixed white light is difficult to be uniform and the light-emission efficiency is low.

It may be also noted that, the particle size of the phosphor is commonly greater than 10 μm, a light scattering may occur on the phosphor surface, therefore the light-emission efficiency is lowered, and an ability of adjusting color temperature and color rendering index is lowered due to the phosphors doped into the filling layer.

Based on the above analysis result, a method for packaging LED light source is provided according to an embodiment of the invention. In the method for packaging LED light source, first, second and third regular phosphor patterns are printed on a surface in a way that every two of the first, the second and the third phosphor patterns are adjacent to each other, to cover the surface of the package structure to the largest extent, therefore the uniformity of light-emission is improved, and the surface of the package structure is free of dead-zone, thereby improving the light-emission efficiency and the quality of the light source.

Furthermore, in an embodiment of the invention, the color temperature and the color rendering indexes of light are controlled by adjusting the thickness of the first, the second and the third phosphor patterns, such that the color temperature and color rendering indexes of the LED light source may have high controllability.

Furthermore, the package structure of LED light source according to the embodiment of the invention is provided with a transparent dam doped with phosphors, thereby expanding light-emission angle of the LED light source.

To make the object, features and advantages of the disclosure better understood, the embodiments of the invention may be described in detail in conjunction with drawings in the following.

A method for packaging LED light source is provided according to an embodiment of the invention. As shown in FIG. 2, the method includes steps S101 and S102 as follows.

S101 is to provide a substrate integrated with LED chips, where a surface of the substrate is provided with a filling layer configured to cover the LED chips;

S102 is to print, on the a surface of the filling layer, phosphor patterns to cover the surface of the filling layer, where the phosphor patterns include one or more first phosphor patterns, one or more second phosphor patterns and one or more third phosphor patterns, where every two of the first, the second and the third phosphor patterns are adjacent to each other.

As shown in FIG. 3, a substrate 200 is provided, where the substrate 200 serves as a carrier for the LED chips and provides a platform for the packaging process. The substrate 200 may be conductive or nonconductive, for example, the substrate 200 may be a ceramic substrate, an aluminum substrate, a glass substrate, a silicon substrate, an aluminium oxide substrate, an aluminum nitride substrate or a copper substrate. For example, the substrate 200 may be a high thermal conductivity aluminum substrate (i.e., a MCPCB), a thick-film ceramic substrate, multilayered low temperature co-fired ceramic substrate, a thin-film ceramic substrate, a silicon substrate, a carborundum substrate, an anodized aluminum substrate or an aluminum nitride substrate. An upper surface and a lower surface of the substrate 200 are provided with at least a circuit structure (not shown in FIG. 3). The circuit structure, after being applied with voltage, may drive or assist to drive the LED chips integrated onto the surface of the substrate 200 in the subsequent steps.

The heat dissipation in the package structure of the LED chips usually encounters the bottleneck in heat conduction from the LED chips to the substrate 200 and then to the circuit structure. As an example, a high thermal conductivity aluminum substrate is selected as the substrate 200, and then the heat of the LED chips may be dissipated to the external environment via the high thermal conductivity aluminum substrate, in order to prevent the heat exerting too much influence to the circuit structure.

It may be noted that, those skilled in the art may understand that, the type and size of the substrate 200 may adapt to the actual product, and it is emphasized herein that the scope of the disclosure is not limited thereto. As an example, the substrate 200 may be round, quadrate, pentagonal, hexagonal, etc.

As shown in FIG. 4, multiple LED chips 201 are integrated onto the surface of the substrate 200.

The LED chip 201 has a p-n junction formed by process such as pre-injection or doping, and electrons and holes flow from electrodes into the junction under the action of voltage. Once a recombination of a hole and an electron meeting each other in the p-n junction occurs, the electron falls into a lower energy level and releases energy in the form of photons, thereby producing light. The light emitted by the LED chip 201 is applicable in exciting the first, the second and the third phosphor patterns to emit light which may be mixed into white light or light of other colors.

In an embodiment, the LED chip 201 is a blue light LED chip. In other embodiments, the LED chip 201 may be a purple light LED chip. In the embodiment, illustration is made by taking a case that the LED chip 201 is a blue light LED chip as an example, which is not meant to limit the invention.

In addition, it may be noted that, the LED chips 201 may be of a horizontal-structure or a flip structure.

The process of integrating the LED chips 201 onto the surface of the substrate 200 may depend on the type of the LED chips 201. For example, the LED chips 201 may be integrated onto the surface of the substrate 200 by eutectic technology, metal welding or wire-binding.

In an embodiment, in a case that the LED chip 201 is of a horizontal-structure, heat-conducting epoxy resin, conductive paste or conductive silver paste are coated on pre-placed points for the LED chips on the substrate 200, and the horizontal-structure LED chips are adhered to the pre-placed points, and then a heat-treatment processing may be performed to increase the adhesive strength between the LED chips 201 and the substrate 200. After being adhered to the substrate 200, the LED chips 201 are interconnected to each other or connected to the circuit structure of the substrate 200 by means of wire-bonding.

Figure 5:
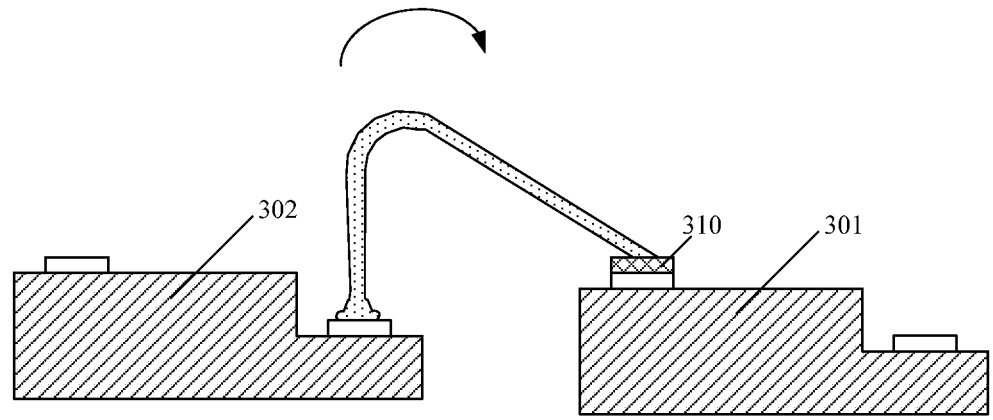

It may be noted that, in a case that a negative terminal of a first LED chip is connected to a positive terminal of a second LED chip, the circuit interconnection is weak and a circuit malfunction may resulted from the connection. To improve the circuit interconnection formed by means of wire-bonding and avoid the circuit malfunction, referring to FIG. 5, in the embodiment, for electrically connecting a first LED chip 301 with horizontal-structure to a second LED chip 302 with horizontal-structure, a metallic bead 301 is formed at a positive terminal of the first LED chip 301 with horizontal-structure, and then wiring is performed from a negative terminal of the second LED chip 302 with horizontal-structure to the metallic bead at the positive terminal of the first LED chip 301 with horizontal-structure. The metallic bead 310 may avoid welding pads at the positive and negative terminals of the horizontal-structure LED chips from being detached due to a change of tension of the connecting wires in the process of wiring.

The positive and negative terminals of the horizontal-structure LED chip are both on a top surface of the LED chip, and the negative terminal is exposed by removing part of the positive terminal and the internal structure of the LED chip. The positive and negative terminals are in a step-like shape, and the exposed area of the negative terminal is much smaller than the area of the positive terminal. To avoid the circuit malfunction occurring in a case that the connecting wire contacts a side wall of the step in the process of wiring, the wiring may be performed in the direction from the negative terminal of the second LED chip 302 with horizontal-structure to the positive terminal of the first LED chip 301 with horizontal-structure.

Figure 6:
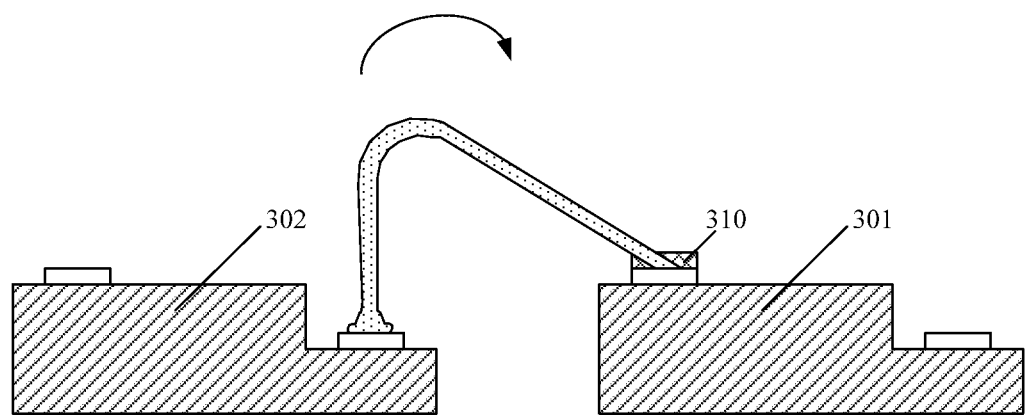

In another embodiment, as shown in FIG. 6, in a case that the first LED chip 301 with horizontal-structure is to be connected electrically to the second LED chip 302 with horizontal-structure, wiring is performed from the negative terminal of the second LED chip 302 with horizontal-structure to the positive terminal of the first LED chip 301 with horizontal-structure, and then a metallic bead 310 is planted on the surface of the positive terminal of the first LED chip 301 with horizontal-structure to strength a binding force between the connecting wire and the welding pads at the positive and negative terminals.

In another embodiment, in a case that the first LED chip with horizontal-structure is to be connected electrically to the second LED chip with horizontal-structure, a metallic bead is formed at the positive terminal of the first LED chip with horizontal-structure, and wiring is performed from the negative terminal of the second LED chip with horizontal-structure to the positive terminal of the first LED chip with horizontal-structure, and subsequently a metallic bead is planted on the surface of the positive terminal of the first LED chip with horizontal-structure, thereby reducing difficulty in wiring from the negative terminal of the second LED chip with horizontal-structure to the metallic bead at the positive terminal of the first LED chip with horizontal-structure and strengthening the circuit interconnection formed by means of wire-binding.

Figure 7:

To make the embodiment better understood, FIG. 7 shows the connecting wire formed in the process of wiring from the negative terminal of the second LED chip 302 with horizontal-structure to the positive terminal of the first LED chip 301 with horizontal-structure and planting a metallic bead 310 at the positive terminal of the first LED chip 301 with horizontal-structure. As shown in FIG. 7, an end of the connecting wire is like a fishtail due to presence of the metallic bead 310, and the fishtail-like connecting wire may strengthen a binding force between the connecting wire and the welding pads at the positive and negative terminals of the horizontal-structure LED chips.

Figure 8:
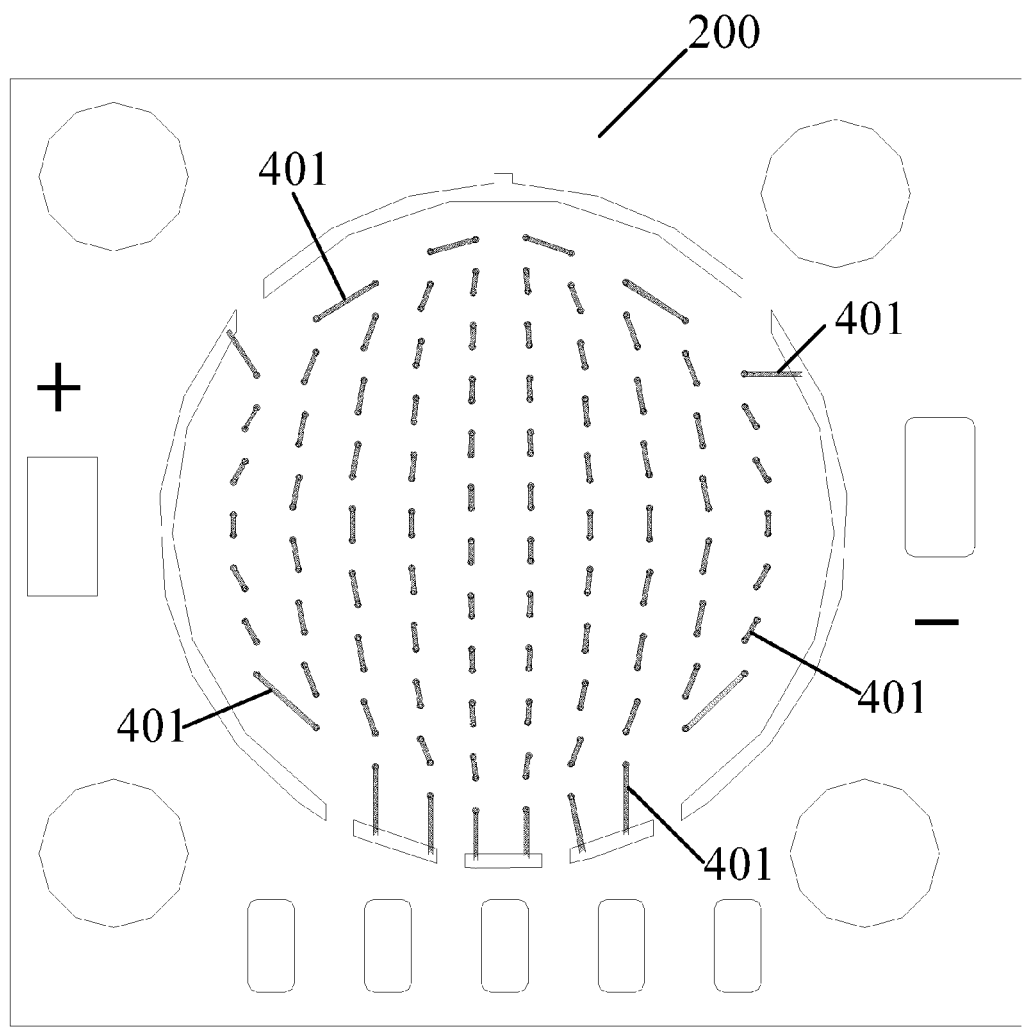

In another embodiment, in a case that the LED chip 201 is of a flip structure in which a light-emission area is opposite to an electrode area, as shown in FIG. 8, predetermined eutectic lines 401 are formed on the surface of the substrate 200, where the eutectic lines may be formed by means of physical vapor deposition. The predetermined eutectic lines 401 is to be connected to the LED chips 201 to be integrated subsequently.

Figure 9:
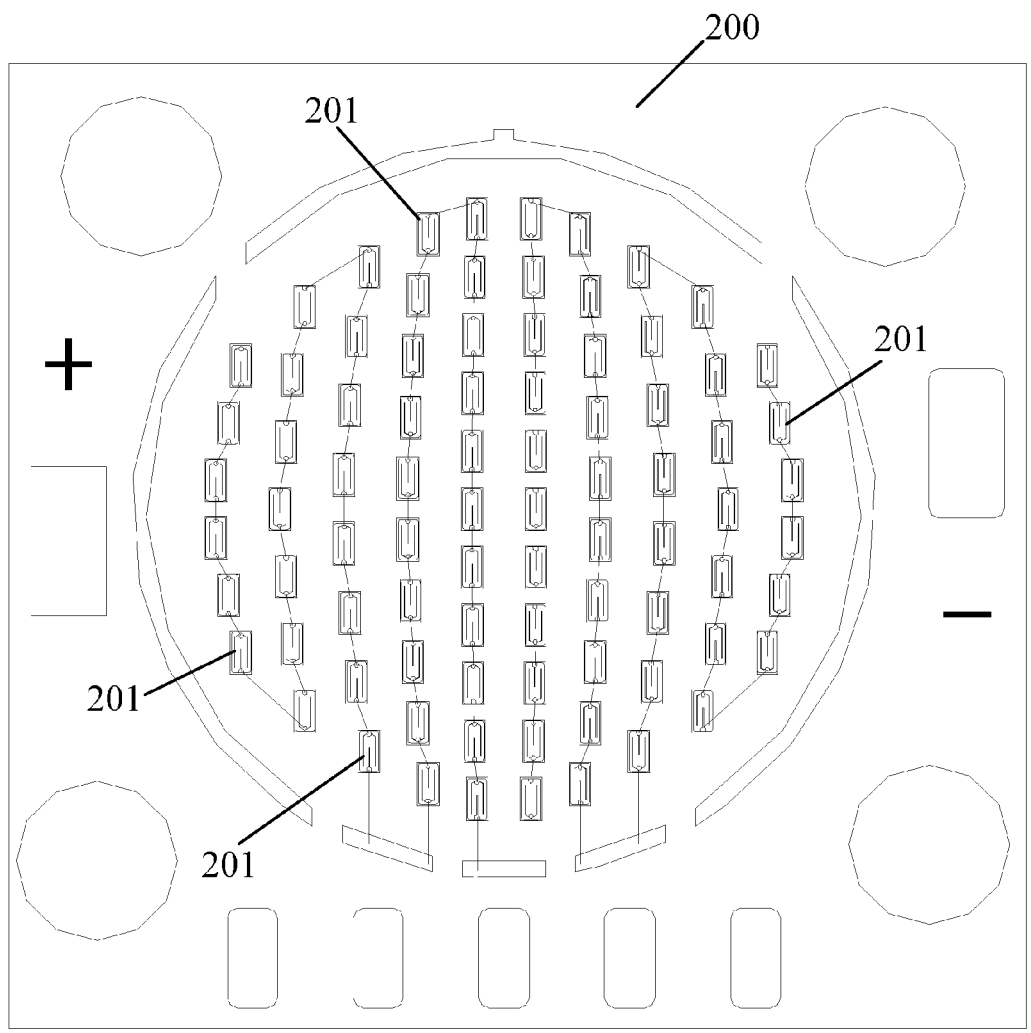

As shown in FIG. 9, the LED chips 201 are formed correspondingly on the eutectic lines by means of eutectic technology.

As an example, to connect a positive terminal of a first LED chip to a negative terminal of a second LED chip, the positive terminal of the first LED is connected to one end of a eutectic line in eutectic manner, and the negative terminal of the second LED chip is connected to the other end of the eutectic line in eutectic manner; the one or more LED chips 201 are integrated onto the surface of the substrate 200 one by one.

Figure 10:
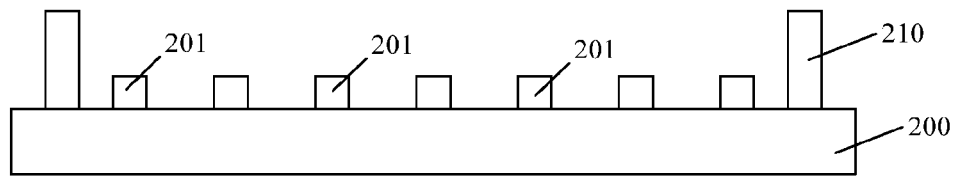

As shown in FIG. 10, after all the LED chips 201 are integrated onto the surface of the substrate 200, a transparent dam 210 doped with phosphors is formed around the LED chips 201 on the surface of the substrate 200.

The transparent dam 210 doped with phosphors provides a platform for forming a filling layer on the surface of the LED chips 201, and the transparent dam 210 doped with phosphors may expanse light-emission angle of the package structure of the LED light source and improve a uniformity of light. In addition, the transparent dam 210 doped with phosphors may prevent external dust and water vapor from entering the LED chips.

As an example, the transparent dam 210 doped with phosphors is higher than the surface of the LED chips 201.

The transparent dam 210 doped with phosphors surrounds the LED chips 201 to form a groove, and then filling material may be filled into the groove to form a filling layer.

The transparent dam 210 is made of material suitable for injection moulding.

The transparent dam 210 is made of silicone, transparent resin, polycarbonate or polyvinyl chloride. The doped phosphors may be single-color phosphors such as red phosphors, green phosphors, yellowish green phosphors or yellow phosphors, or mix-color phosphors such as a mixture of red, green and yellow phosphors, a mixture of red and green phosphors or a mixture of yellow and green phosphors.

It may be noted that, the transparent dam doped with phosphors may overcome a defect in the conventional technology that the light-emission angle of a white non-transparent dam is narrow. In addition, the transparent dam doped with phosphors may emit light under an excitation of the light emitted by the LED chips 201, thereby expanding the light-emission angle of the package structure of the LED and improving the luminous efficiency.

The process of forming the transparent dam doped with phosphors is illustrated by taking a case that the transparent dam doped with phosphors is made of silicone as an example. The process includes providing silicone and phosphors proportional to the silicone; mixing the phosphor into the silicone to form a mixture and stirring the mixture well to form fluorescent glue; providing a mold corresponding to the dam; placing the mold and the substrate 200 on a pressing machine and vacuumizing; injecting the fluorescent glue into the mold; forming the transparent dam doped with the phosphors around the LED chips 201 by means of high-temperature mold pressing and solidifying.

It may be also noted that, the transparent dam may be made of methyl silicone. The methyl silicone is of good particle dispersibility, the phosphors may be distributed uniformly in the methyl silicone after being mixed into the methyl silicone, such that a light-emission uniformity of the transparent dam may be improved.

Figure 11:
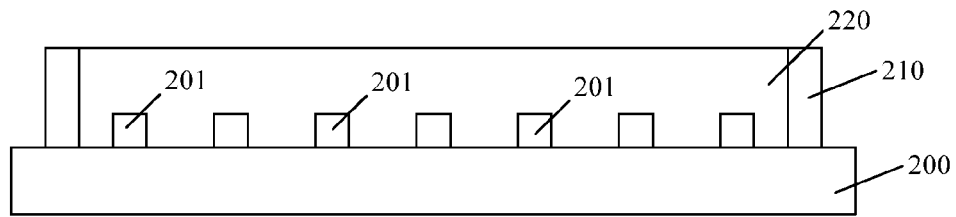

As shown in FIG. 11, transparent filling material is injected into the transparent dam doped with phosphors, and a filling layer 220 covering the LED chips 201 is formed.

The transparent filling material may be silicone, transparent resin, polycarbonate or polyvinyl chloride, and a surface of the filling layer 220 is like a convex lens or is flat. In a case that the surface of the filling layer 220 is like a convex lens, the filling layer 220 is thick at the center and thin at the edge, such that a path in which the light emitted by the LED chip 201 passes through the filling layer 220 may be extended, and a color temperature difference of the light passing through the filling layer 220 from different positions may be smaller.

The process of forming the filling layer 220 includes: injecting, by a dispenser, the transparent filling material into the transparent dam; rendering the surface of the filling layer 220 to be like a convex lens or be flat by controlling a surface tension of the transparent filling material and a boundary limitation of the transparent dam 210.

Figure 12:
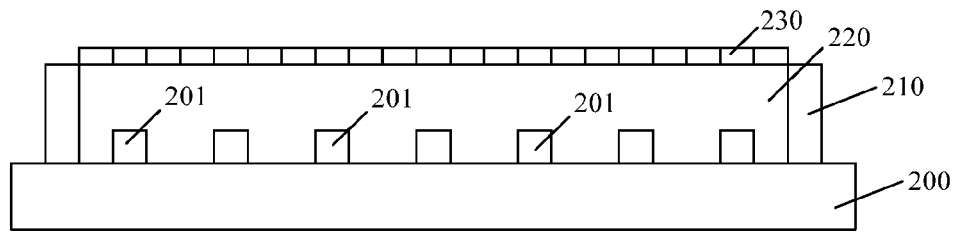

As shown in FIG. 12, phosphor patterns 230 are printed on the surface of the filling layer 220 to cover the surface of the filling layer 220.

The phosphor patterns 230 include one or more first phosphor patterns, one or more second phosphor patterns and one or more third phosphor patterns, where every two of the first, the second and the third phosphor patterns are adjacent to each other.

As an embodiment, the first phosphor pattern is red, yellow, green or yellowish green phosphor pattern. The second phosphor pattern is red, yellow, green or yellowish green phosphor pattern. The third phosphor pattern is red, yellow, green or yellowish green phosphor pattern.

As another embodiment, the first phosphor pattern is red phosphor pattern, the second phosphor pattern is yellow phosphor pattern, and the third phosphor pattern is green phosphor pattern.

In the embodiment, every two of the red, yellow and green phosphor patterns are adjacent to each other, such that the red, yellow and green phosphor patterns in the phosphor patterns 230 may be distributed uniformly, such that the LED chip 201 may excite more efficiently the phosphors in the red, yellow and green phosphor patterns, and the red light emitted by exciting the red phosphor pattern, the yellow light emitted by exciting the yellow phosphor pattern and the green light emitted by exciting the green phosphor pattern may be distributed uniformly, and the emission of the mixed white light may be more uniform.

Figure 13:
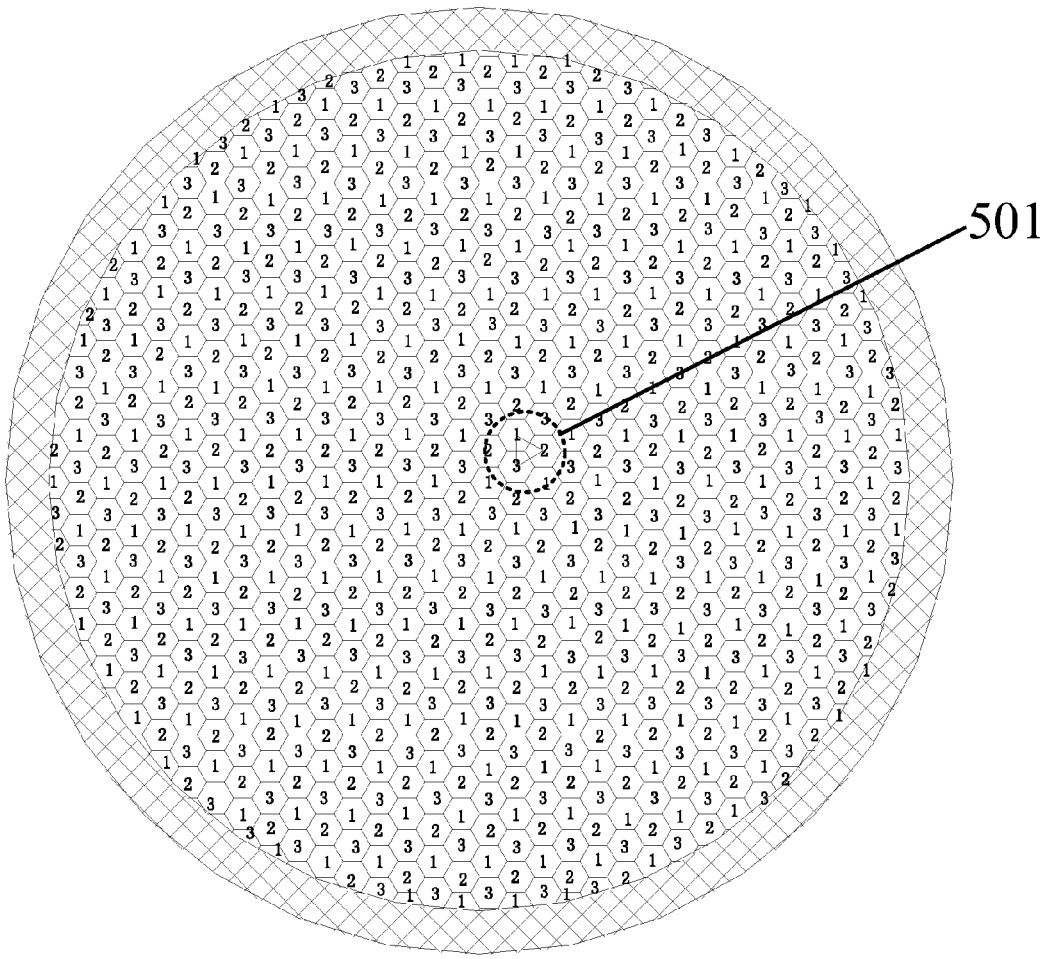
Figure 14:
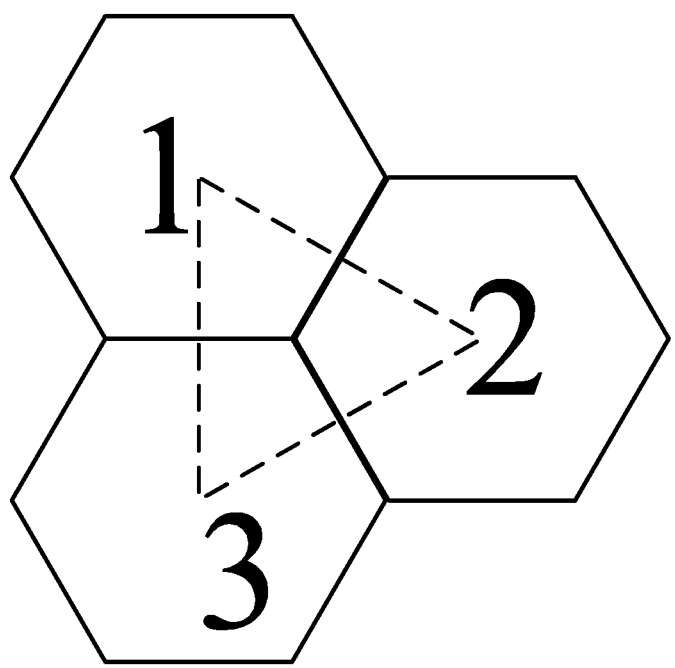

Furthermore, referring to FIG. 13 and FIG. 14, FIG. 13 is a schematic diagram of phosphor patterns provided according to another embodiment of the invention, and FIG. 14 is an enlarged partial diagram of a part 501 of the phosphor pattern. In the embodiment, red phosphor patterns 1, yellow phosphor patterns 2 and green phosphor patterns 3 are all regular hexagon-shaped, and every two of the red phosphor patterns 1, the yellow phosphor patterns 2 and the green phosphor patterns 3 are adjacent to each other.

In the embodiment, the red phosphor pattern 1, the yellow phosphor pattern 2 and the green phosphor pattern 3 are selected to be all regular hexagon-shaped, such that every two of the red phosphor patterns 1, the yellow phosphor patterns 2 and the green phosphor patterns 3 may be adjacent to each other without gaps, thereby the emission of the mixed white light may be more uniform. As shown in FIG. 13 and FIG. 14, lines jointing centers of the red phosphor pattern 1, the yellow phosphor pattern 2 and the green phosphor pattern 3 form an equilateral triangle, such that the red phosphor patterns 1, the yellow phosphor patterns 2 and the green phosphor patterns 3 may be arranged as closely as possible and arranged uniformly on the surface of the filling layer 220, thereby the light-emission of the mixed white light may be more uniform.

In addition, in a case that the light-emitting surface of the substrate 200 is round, the patterns in the shape of regular hexagon may fill the round light-emitting surface of the substrate 200 to the largest extent, thereby the substrate may be used more adequately and LED chips 201 may excite the phosphors more efficiently.

Figure 15:
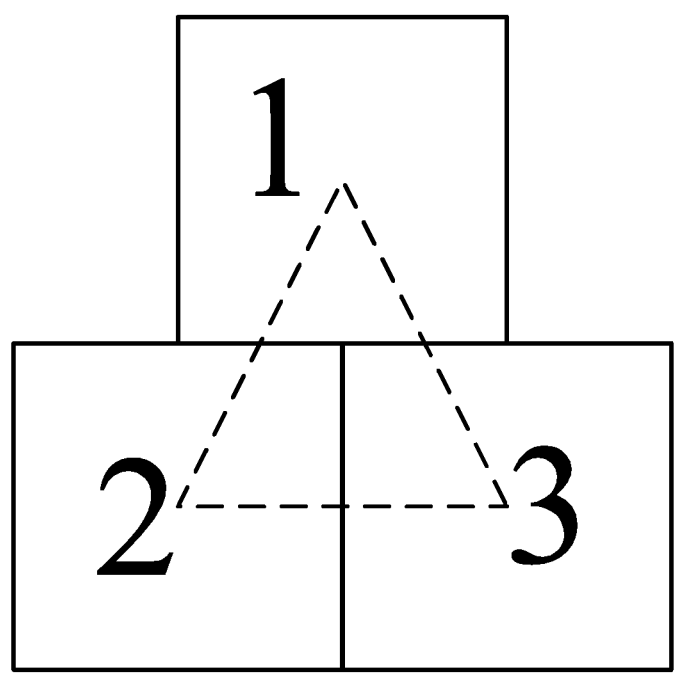

In anther embodiment, as shown in FIG. 15, the red phosphor patterns 1, the yellow phosphor patterns 2 and the green phosphor patterns 3 are all square-shaped. In a case that the light-emitting surface of the substrate 200 is square, the square-shaped patterns may fill the square-shaped light-emitting surface of the substrate 200 to the largest extent, i.e., lines jointing centers of the red phosphor pattern 1, the yellow phosphor pattern 2 and the green phosphor pattern 3 form an equilateral triangle, thereby the light-emitting surface of the substrate may be used more adequately and LED chips 201 may excite the phosphors more efficiently.

In another embodiment, the color temperature and color rendering indexes of light-emission may be controlled by adjusting the thicknesses of the first, the second and the third phosphor patterns.

The color temperature and color rendering indexes of light-emission are controlled by adjusting the thicknesses of the red phosphor patterns 1, the yellow phosphor patterns 2 and the green phosphor patterns 3, such that the color temperature and color rendering indexes of the LED light source may have high controllability.

A package structure of LED light source is further provided according to an embodiment of the invention. As shown in FIG. 12, the package structure includes:

a substrate 200 integrated with LED chips 201;

a filling layer 220, disposed on a surface of the substrate 200 and covering the LED chips 201;

phosphor patterns 230 covering a surface of the filling layer, where the phosphor patterns 230 include one or more first phosphor patterns, one or more second phosphor patterns and one or more third phosphor patterns, where every two of the first, the second and the third phosphor patterns are adjacent to each other.

In the embodiment, first, second and third phosphor patterns are printed and regularly arranged on a surface of the package structure of the LED light source, the patterns may cover the surface of the package structure to the largest extent, such that the light-emission is uniform and the surface of the package structure is free of dead-zone, thereby improving a light-emission efficiency and a quality of the light source.

As an embodiment, the first phosphor pattern is red, yellow, green or yellowish green, the second phosphor pattern is red, yellow, green or yellowish green, and the third phosphor pattern is red, yellow, green or yellowish green.

As another embodiment, the first phosphor pattern is red, the second phosphor pattern is yellow, and the third phosphor pattern is green.

Furthermore, the package structure of the LED light source further includes a transparent dam 210 doped with phosphors disposed on the surface of the substrate and around the LED chips 201. The transparent dam 210 doped with phosphors may expand light-emission angle and improve uniformity of light-emission of the package structure of the LED light source. In addition, the transparent dam 210 doped with phosphors may prevent external dust and water vapor from entering the LED chips.

As an example, the transparent dam 210 doped with phosphors is higher than the surfaces of the LED chips 201.

The transparent dam 210 is made of silicone, transparent resin, polycarbonate or polyvinyl chloride. The doped phosphors may be single-color phosphors such as red phosphors, green phosphors, yellowish green phosphors or yellow phosphors, or mix-color phosphors such as a mixture of red, green and yellow phosphors, a mixture of red and green phosphors or a mixture of yellow and green phosphors.

It may be noted that, the transparent dam doped with phosphors may overcome a defect in the conventional technology that the light-emission angle of a white non-transparent dam is narrow. In addition, the transparent dam doped with phosphors may emit light under an excitation of the light emitted by the LED chips 201, thereby expanding the light-emission angle of the package structure of the LED and improving the luminous efficiency.

The LED chip 201 may be integrated onto the substrate 200 by means of wire-binding or eutectic technology.

In a case that the LED chips 201 are integrated onto the surface of the substrate 200 by means of wire-binding, the package structure of the LED light source further includes a metallic bead disposed at a positive terminal of a first LED chip, and a binding wire connecting a negative terminal of a second LED chip to the metallic bead at the positive terminal of the first LED chip. The first and the second LED chips are any two of the LED chips 201 to be connected electrically.

In another embodiment, in a case that the LED chips 201 are integrated onto the surface of the substrate 200 by means of wire-binding, the package structure of the LED light source further includes a binding wire connecting the positive terminal of the first LED chip to the negative terminal of the second LED chip, and a metallic bead overlaying the binding wire at the positive terminal of the first LED chip.

In another embodiment, in a case that the LED chips 201 are integrated onto the surface of the substrate 200 by means of wire-binding, the package structure of the LED light source further includes a metallic bead at the positive terminal of the first LED chip, a binding wire connecting the negative terminal of the second LED chip and the metallic bead at the positive terminal of the first LED chip, and another metallic bead overlaying the binding wire at the positive terminal of the first LED chip.

Figure 16:
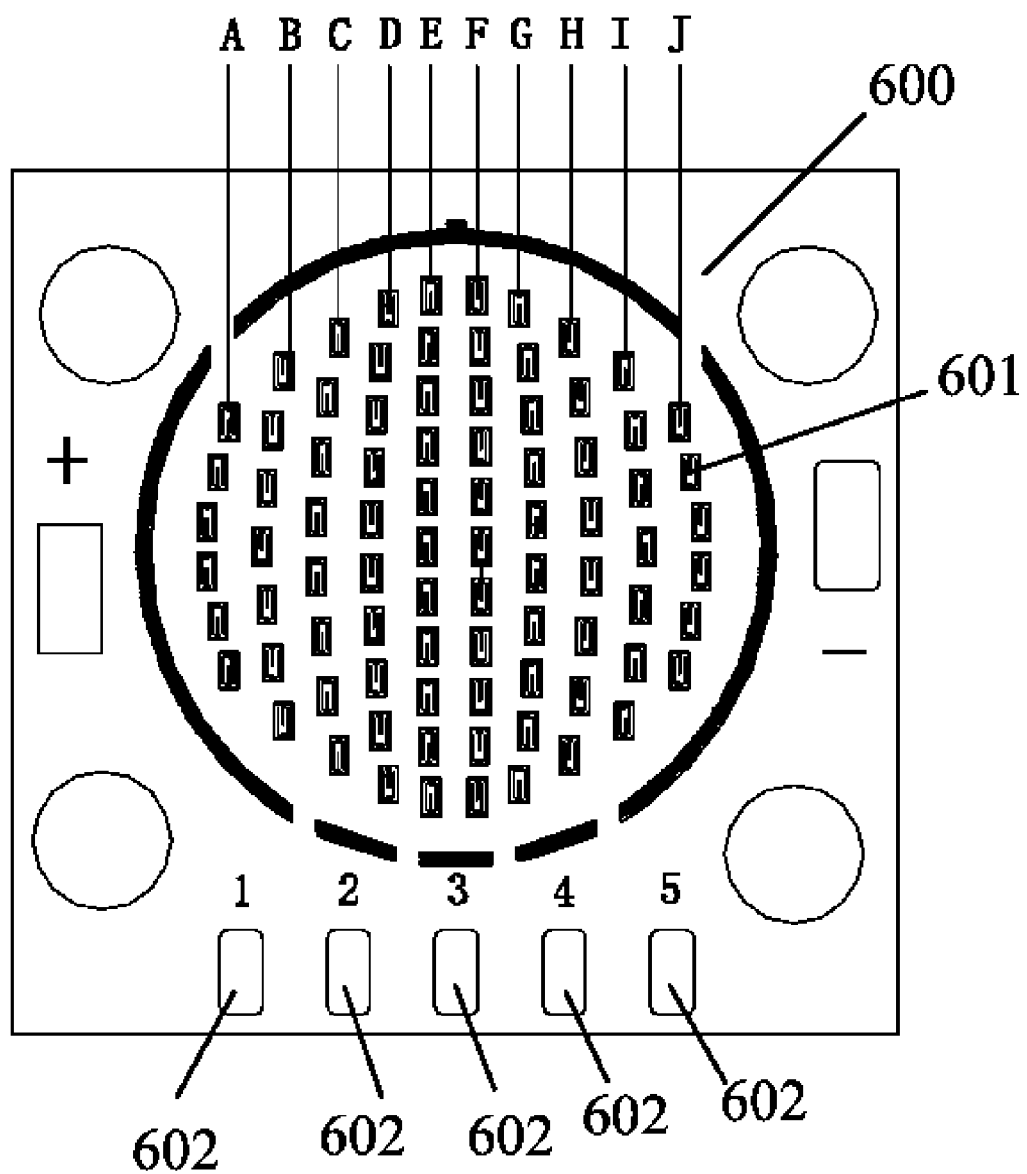
FIG. 16 is a schematic diagram of a light source module provided according to an embodiment of the invention.

As shown in FIG. 16, a light source module is provided according an embodiment of the invention, including: a substrate 600; one or more LED chips 601 integrated onto a surface of the substrate 600, where the LED chips 601 are arranged in queues, and LED chips 601 in each queue are connected sequentially; input ports 602 arranged at periphery of the substrate 600, where an amount of the input ports 602 is equal to an amount of the queues, and each input port 602 is connected electrically to a queue of LED chips 601, where the input ports 602 are connected to an external power supply (not shown in FIG. 16), and any one among the queues of LED chips 601 may emit light in response to a control to the power supply and a brightness of the light source module may be controlled.

As an example, one input port 602 may be connected to one queue of LED chips 601, or alternatively one input port 602 may be connected to multiple queues of LED chips 601, such that any queue or multiple queues of LED chips 601 may emit light in response to the control to the power supply, and then the brightness of the light source module may be controlled.

The substrate 600 may be conductive or nonconductive, which may be a ceramic substrate, an aluminum substrate, a glass substrate, a silicon substrate, an aluminium oxide substrate, an aluminum nitride substrate or a copper substrate. With respect to the substrate 600, reference may be made to the description of the substrate in the embodiments of the method for packaging LED light source and detailed description thereof is omitted herein.

The LED chips 601 may be integrated to the substrate 600 by means of wire-binding or eutectic technology. In a case that the LED chips 601 are integrated to the substrate 600 by means of wire-binding, the package structure of the LED light source further includes a metallic bead disposed at a positive terminal of a first LED chip, and a binding wire connecting a negative terminal of a second LED chip to the metallic bead at the positive terminal of the first LED chip.

In another embodiment, in a case that the LED chips 601 are integrated to the substrate 600 by means of wire-binding, the package structure of the LED light source further includes a binding wire connecting the positive terminal of the first LED chip to the negative terminal of the second LED chip, and a metallic bead overlaying the binding wire at the positive terminal of the first LED chip.

The light source module may further include a transparent dam (not shown in FIG. 16) doped with phosphors which is disposed on the surface of the substrate and around the LED chips 601. The transparent dam doped with phosphors may expand light-emission angle and improve uniformity of light-emission of the package structure of the LED light source. In addition, the transparent dam doped with phosphors may prevent external dust and water vapor from entering the LED chips.

The light source module may further include: a filling layer (not shown in FIG. 16) disposed on a surface of the substrate 600 and covering the LED chips 601; phosphor patterns covering a surface of the filling layer, where the phosphor patterns include one or more red phosphor patterns, one or more yellow phosphor patterns and one or more green phosphor patterns, where every two of the red, yellow and green phosphor patterns are adjacent to each other.

In the embodiment, first, second and third phosphor patterns are printed and regularly arranged on a surface of the package structure of the LED light source, the patterns may cover the surface of the package structure to the largest extent, such that the light-emission is uniform and the surface of the package structure is free of dead-zone, thereby improving a light-emission efficiency and a quality of the light source.

As an embodiment, the first phosphor pattern is red, yellow phosphor pattern, green or yellowish green phosphor pattern, the second phosphor pattern is red, yellow, green or yellowish green phosphor pattern, and the third phosphor pattern is red, yellow, green or yellowish green phosphor pattern.

As another embodiment, the first phosphor pattern is a red phosphor pattern, the second phosphor pattern is a yellow phosphor pattern, and the third phosphor pattern is a green phosphor pattern.

In an embodiment, the red, yellow and green phosphor patterns are all regular hexagon-shaped, and every two of the red, yellow and green phosphor patterns are adjacent to each other.

In the embodiment, the red, yellow and green phosphor patterns are selected to be all regular hexagon-shaped, such that every two of the red, yellow and green phosphor patterns may be adjacent to each other without gaps, thereby the light-emission of the mixed white light may be more uniform. In addition, lines jointing centers of the red, yellow and the green phosphor patterns form an equilateral triangle, such that the red, yellow and green phosphor patterns may be arranged as closely as possible and distributed uniformly on the surface of the filling layer, thereby the light-emission of the mixed white light may be more uniform.

In addition, in a case that the light-emitting surface of the substrate 600 is round, the regular hexagon patterns may fill the round light-emitting surface of the substrate 600 to the largest extent, thereby the substrate may be used more adequately and LED chips may excite the phosphors more efficiently.

In anther embodiment, the red, yellow and the green phosphor patterns are all square-shaped. In a case that the light-emitting surface of the substrate is square, the square-shaped patterns may fill the square-shaped light-emitting surface of the substrate to the largest extent, i.e., lines jointing centers of the red, yellow and green phosphor patterns form an equilateral triangle, thereby the substrate may be used more adequately and LED chips may excite the phosphors more efficiently.

In another embodiment, a color temperature and a color rendering index of light-emission are controlled by adjusting the thicknesses of the first, the second and the third phosphor patterns, such that the color temperature and color rendering indexes of the LED light source may have high controllability.

The embodiments of the invention are disclosed in the foregoing description, but there are not meant to limit the invention. Variations or modifications may be made by those skilled in the art without departing from the spirit and scope of the disclosure. Therefore, the protection scope of the invention is subject to the scope of the claims.

The invention claimed is:

1. A method for packaging LED light source, comprising:
providing a substrate integrated with LED chips, wherein a surface of the substrate is provided with a filling layer configured to cover the LED chips; and
forming, on a surface of the filling layer, phosphor patterns to cover the surface of the filling layer, wherein the phosphor patterns comprise one or more first phosphor patterns, one or more second phosphor patterns and one or more third phosphor patterns, wherein every two of the first, the second and the third phosphor patterns are adjacent to each other.

2. The method according to claim 1, wherein the first phosphor pattern is red, yellow, green or yellowish green phosphor pattern, the second phosphor pattern is red, yellow, green or yellowish green phosphor pattern, and the third phosphor pattern is red, yellow, green or yellowish green phosphor pattern.

3. The method according to claim 2, wherein the red, yellow and green phosphor patterns are all regular hexagon-shaped or square-shaped, every two of the red, yellow and green phosphor patterns are adjacent to each other, and lines jointing centers of the red, yellow and the green phosphor patterns form an equilateral triangle.

4. The method according to claim 1, wherein a color temperature and a color rendering index of light-emission are controlled by adjusting thicknesses of the first, the second and the third phosphor patterns.

5. The method according to claim 1, wherein the method further comprises:
forming, on the surface of the substrate, a transparent dam doped with phosphors around the LED chips.

6. The method according to claim 1, wherein the LED chips are integrated to the substrate by eutectic technology, metal welding or wire-binding.

7. The method according to claim 6, wherein in a case that the LED chips are of a horizontal-structure, the LED chips are integrated to the substrate by means of wire-binding.

8. The method according to claim 7, wherein the method comprises forming a metallic bead at a positive terminal of the LED chip with the horizontal-structure; and wiring from a negative terminal to the metallic bead at the positive terminal.

9. The method according to claim 7, wherein the method comprises wiring from a negative terminal of the LED chip with the horizontal-structure to a positive terminal to be connected to the negative terminal; and planting a metallic bead on a surface of the positive terminal after the wiring.

10. The method according to claim 7, wherein the method comprises forming a metallic bead at a positive terminal of the LED chip with the horizontal-structure; wiring from a negative terminal to the metallic bead at the positive terminal; and planting a metallic bead on a surface of the positive terminal after the wiring.

11. The method according to claim 9, wherein a connecting wire formed by the wiring has a fishtail-shaped end.

12. A package structure of LED light source, comprising:
a substrate integrated with LED chips;
a filling layer, which is disposed on a surface of the substrate and covers the LED chips; and phosphor patterns covering a surface of the filling layer, wherein the phosphor patterns comprise one or more first phosphor patterns, one or more second phosphor patterns and one or more third phosphor patterns, wherein every two of the first, the second and the third phosphor patterns are adjacent to each other.

13. The package structure according to claim 12, wherein the first phosphor pattern is red, yellow, green or yellowish green phosphor pattern, the second phosphor pattern is red, yellow, green or yellowish green phosphor pattern, and the third phosphor pattern is red, yellow, green or yellowish green phosphor pattern.

14. The package structure according to claim 13, wherein the red, yellow and green phosphor patterns are all regular hexagon-shaped or square-shaped, every two of the red, yellow and green phosphor patterns are adjacent to each other, and lines jointing centers of the red, yellow and the green phosphor patterns form an equilateral triangle.

15. The package structure according to claim 12, wherein the package structure further comprises a transparent dam doped with phosphors, which is disposed on the surface of the substrate and around the LED chips.

16. The package structure according to claim 12, wherein in a case that the LED chips are integrated to the substrate by means of wire-binding, the package structure of the LED light source further comprises a metallic bead disposed at a positive terminal of a first LED chip, and a binding wire connecting a negative terminal of a second LED chip to the metallic bead at the positive terminal of the first LED chip.

17. The package structure according to claim 12, wherein in a case that the LED chips are integrated to the substrate by means of wire-binding, the package structure of the LED light source further comprises a binding wire connecting a positive terminal of a first LED chip to a negative terminal of a second LED chip, and a metallic bead overlaying the binding wire at the positive terminal of the first LED chip.

18. The package structure according to claim 12, wherein in a case that the LED chips are integrated to the substrate by means of wire-binding, the package structure of the LED light source further comprises a metallic bead disposed at a positive terminal of a first LED chip, a binding wire connecting a negative terminal of a second LED chip to the metallic bead at the positive terminal of the first LED chip, and a metallic bead overlaying the binding wire at the positive terminal of the first LED chip.

19. A light source module, comprising:
a substrate;
one or more LED chips integrated onto a surface of the substrate, wherein the one or more LED chips are arranged in queues, and LED chips in a queue are sequentially connected;
input ports arranged at periphery of the substrate, wherein an amount of the input ports is equal to an amount of the queues, and the input ports are connected electrically to corresponding queues of LED chips, wherein the input ports are connected to an external power supply, and a brightness of the light source module is controlled by enabling any queue of LED chips to emit light in response to a control to the power supply;
a filling layer, which is disposed on the surface of the substrate and covers the LED chips; and
phosphor patterns covering a surface of the filling layer, wherein the phosphor patterns comprise one or more red phosphor patterns, one or more yellow phosphor patterns and one or more green phosphor patterns, wherein every two of the red, yellow and green phosphor patterns are adjacent to each other.

20. The light source module according to claim 19, wherein the light source module further comprises a transparent dam doped with phosphors which is disposed on the surface of the substrate and around the LED chips.

* * * * *